US006062875A

United States Patent [19]

Konno et al.

[11] Patent Number: 6,062,875

[45] Date of Patent: May 16, 2000

[54] ELECTRICAL CONNECTOR WITH MINIMIZED SOCKET OPENING

[75] Inventors: Takeshi Konno; Shuichi Sasajima, both of Ibaraki-ken, Japan

[73] Assignee: Mitsumi Electric Co., Ltd., Japan

[21] Appl. No.: 09/153,716

[22] Filed: Sep. 15, 1998

[30] Foreign Application Priority Data

Oct. 30, 1997 [JP] Japan .................................... 9-314293

[51] Int. Cl.[7] .............................. H01R 12/00; H05K 1/00

[52] U.S. Cl. ................................................................ 439/74

[58] Field of Search ............................... 439/74, 55, 660, 439/637, 636, 341, 376

[56] References Cited

U.S. PATENT DOCUMENTS 4,799,896 1/1989 Gaynor et al. .......................... 439/232

5,830,018 11/1998 Simmel .................................. 439/660

*Primary Examiner*—Renee Luebke
*Assistant Examiner*—Michael C. Zarroli
*Attorney, Agent, or Firm*—Morrison Law Firm

[57] ABSTRACT

A connector socket has a plug insertion opening that is as small as possible to prevent insertion of fingers or other object. The mating plug travels on a hinged arcuate path into the plug insertion opening. The plug insertion opening is displaced from a centerline of its contacts to provide clearance permitting the mating plug to enter, while maintaining a minimum opening size. A front surface of the connector socket surrounding the plug insertion opening is a grounded conductive plate. Thus, even if one succeeds in forcing a finger or other charged object through the plug insertion opening, static charges are discharges to the conductive plate, and therefore do not pose a threat of electrical damage to components accessible within the plug insertion opening.

6 Claims, 5 Drawing Sheets

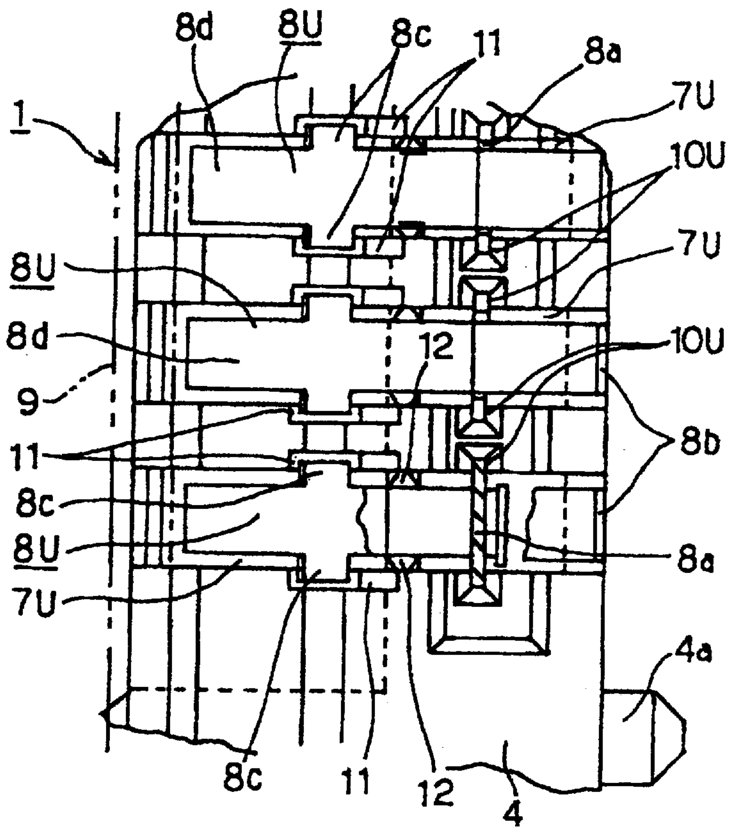
Fig. 4
Fig. 5
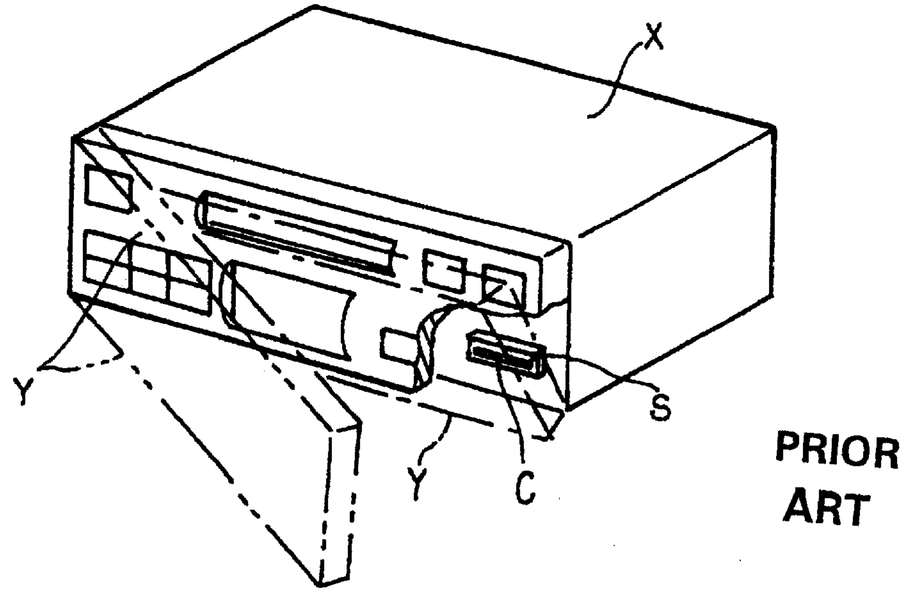
PRIOR ART

ELECTRICAL CONNECTOR WITH MINIMIZED SOCKET OPENING

BACKGROUND OF THE INVENTION

The present invention relates to an electrical connector. More specifically, the present invention relates to a connector socket used in conjunction with a connector plug.

Referring to FIG. 5, there is shown a car stereo. A well-known method for preventing car stereos from being stolen from a parked car involves a front panel Y that is detachable from a main stereo unit X. When the car is parked, front panel Y, on which buttons and the like are mounted, is removed and carried.

Referring to the dotted lines with double dashes in FIG. 5, a removable hinge can be attached to one side of main stereo unit X, which is longer horizontally than vertically.

Referring to FIG. 6, a connector plug P and a connector socket S are disposed on front panel Y and main stereo unit X, respectively, to provide electrical contact between main stereo unit X and front panel Y.

A connector socket S used in this manner includes a connector mold A that is longer horizontally than vertically. A horizontal plug insertion opening C is formed on the surface of connector mold A to receive a plug section B of connector plug P, which is attached to the back surface of front panel Y.

A plurality of connector pairs D1, D2 are disposed within connector mold A in a symmetrical arrangement relative to plug insertion opening C. Connectors D1, D2 include pressure-contact ends d1, which are able to come into contact with plug contacts b of plug section B.

Connector mold A is open on the side facing main stereo unit X. Contacts are mounted in connector mold A from the back side of connector mold A. Positioning projections, formed on attachment bases d2, are fixed to attachment grooves E1, E2, which are disposed from front to back in connector mold A. Pressure-contact ends d1, which are continuous with U-shaped deformation absorbers d3, project into plug insertion opening C.

In conventional contacts D1, D2, external connection terminals d4 are bent vertically at right angles, into the dashed position shown, after attachment base d2 is attached to attachment grooves E1, E2. External connection terminals d4 are then soldered in main stereo unit X to the printed circuit substrate or the like to which connector mold A is fixed.

Some recent car stereos use a “bottom hinge” to attach front panel Y to main stereo unit X as indicated in the dotted lines with single dashes from FIG. 5. However, in this type of front panel Y with a bottom hinge, the plug section of the connector plug is inserted into plug insertion opening C via an arcuate path with a relatively proximal center of rotation. This requires plug insertion opening C to have a wider opening, thus increasing the chance of contacts D1, D2, which are positioned inside plug insertion opening C, coming into contact with foreign objects such as fingers.

If a statically charged finger or the like comes into direct contact with contacts D1, D2, the static charge at the fingertip flows from contacts D1, D2 to the circuit within main stereo unit X possibly damaging the internal circuit.

OBJECTS AND SUMMARY OF THE INVENTION

The object of the present invention is to overcome the problems of the conventional connector socket described above and to provide a connector socket with a plug insertion opening whose area is as small as possible so that a finger or the like cannot be inserted, and that can protect the internal circuit even if a finger comes into contact with the plug insertion opening.

In order to achieve the objects described above, the present invention proposes a connector socket that includes a long, thin connector mold having a surface having formed thereon a plug insertion opening for receiving a plug section of a long, thin connector plug. A plurality of pairs of contacts are mounted inside the connector mold and are arranged facing each other along a direction perpendicular to the length of the connector mold. The plug insertion opening is formed on the connector mold so that it is disposed away from the midpoint of a line connecting facing contacts.

In the description of the preferred embodiments of the present invention presented below, there is also described a shield plate disposed at a surface of the connector mold and surrounding the plug insertion opening. Furthermore, there is also described a plurality of pairs of contact holding chambers formed side by side along the length of the connector mold. The contacts held in the contact holding chambers are mounted from the sides of the connector mold into corresponding contact holding chambers, which are opened toward either side of the connector mold.

Briefly stated, the present invention provides a connector socket that has a plug insertion opening that is as small as possible to prevent insertion of fingers or other object. The mating plug travels on a hinged arcuate path into the plug insertion opening. The plug insertion opening is displaced from a centerline of its contacts to provide clearance permitting the mating plug to enter, while maintaining a minimum opening size. A front surface of the connector socket surrounding the plug insertion opening is a grounded conductive plate. Thus, even if one succeeds in forcing a finger or other charged object through the plug insertion opening, static charges are discharges to the conductive plate, and therefore do not pose a threat of electrical damage to components accessible within the plug insertion opening.

According to an embodiment of the invention, there is provided a connector socket comprising: a connector mold, a plug insertion opening on a surface of said connector mold, said plug insertion opening being positioned for receiving a plug section of a connector plug, said connector plug being movable along an arcuate path into said plug insertion opening, a plurality of pairs of contacts facing each other across a width of said plug insertion opening and arranged along a length of said connector mold; and said plug insertion opening is displaced from a centerline of said facing pairs of contacts thereby enabling a width of said plug insertion opening to be minimized.

According to a feature of the invention, there is provided a connector socket comprising: a connector mold, said connector mold including at least a first contact holding chamber, said contact holding chamber having an opening in its side, a base attachment groove in said connector mold passing from said opening into said contact holding chamber, a contact, said contact including a base enlargement, said base enlargement being slidably fitted into and along said base attachment groove to permit installation of said contact into said contact holding chamber from said side during assembly of said connector socket, and at least one engagement member contacted by said contact preventing drawing of said contact from said contact holding chamber when a mating connector plug is withdrawn.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1(*b*) is a perspective drawing showing the arcuate path between the connector socket and the connector plug.

FIG. 4 is an enlarged top-view drawing of the connector socket.

FIG. 5 is a perspective drawing of a conventional car stereo with a section cut away.

DETAILED DESCRIPTION OF THE PREFERRED EMBODIMENTS

Referring to FIG. 1 through FIG. 4, the following is a detailed description of the embodiments of the present invention.

The connector socket of the embodiment shown in the figures has a structure suited for a front panel Y that is attached to main stereo unit X via a bottom hinge.

Figure 1A:
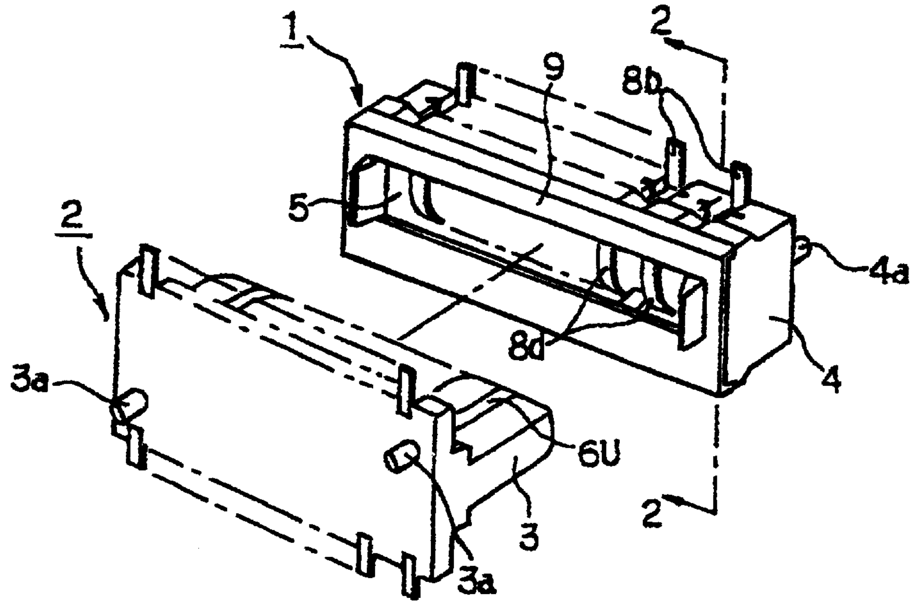
FIG. 1(*a*) is a perspective drawing showing the relationship between the connector socket and the connector plug.
Figure 2:
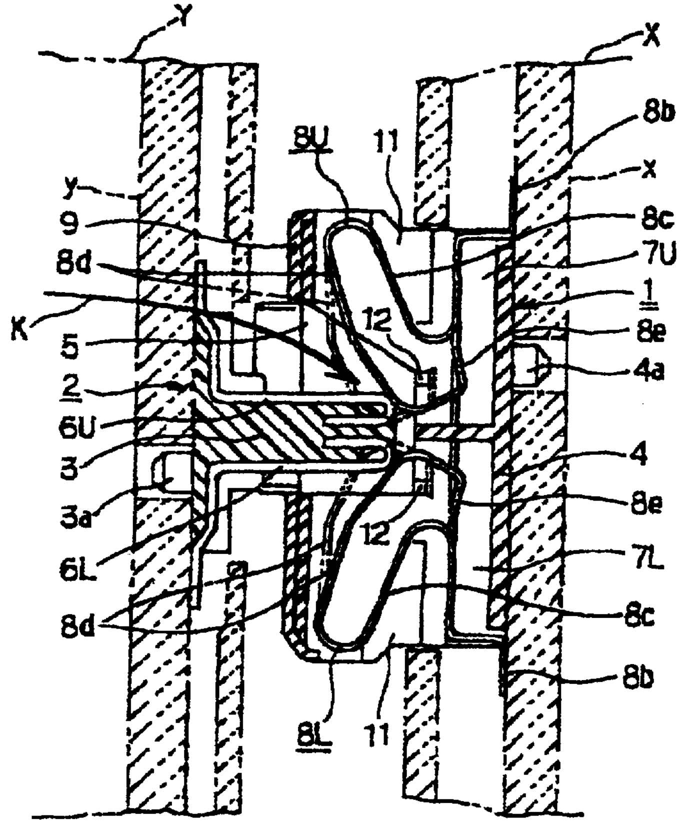
FIG. 2 is a cross-section drawing along line 2—2 in FIG. 1 showing the relationship between the connector socket and the connector plug.
Figure 1B:
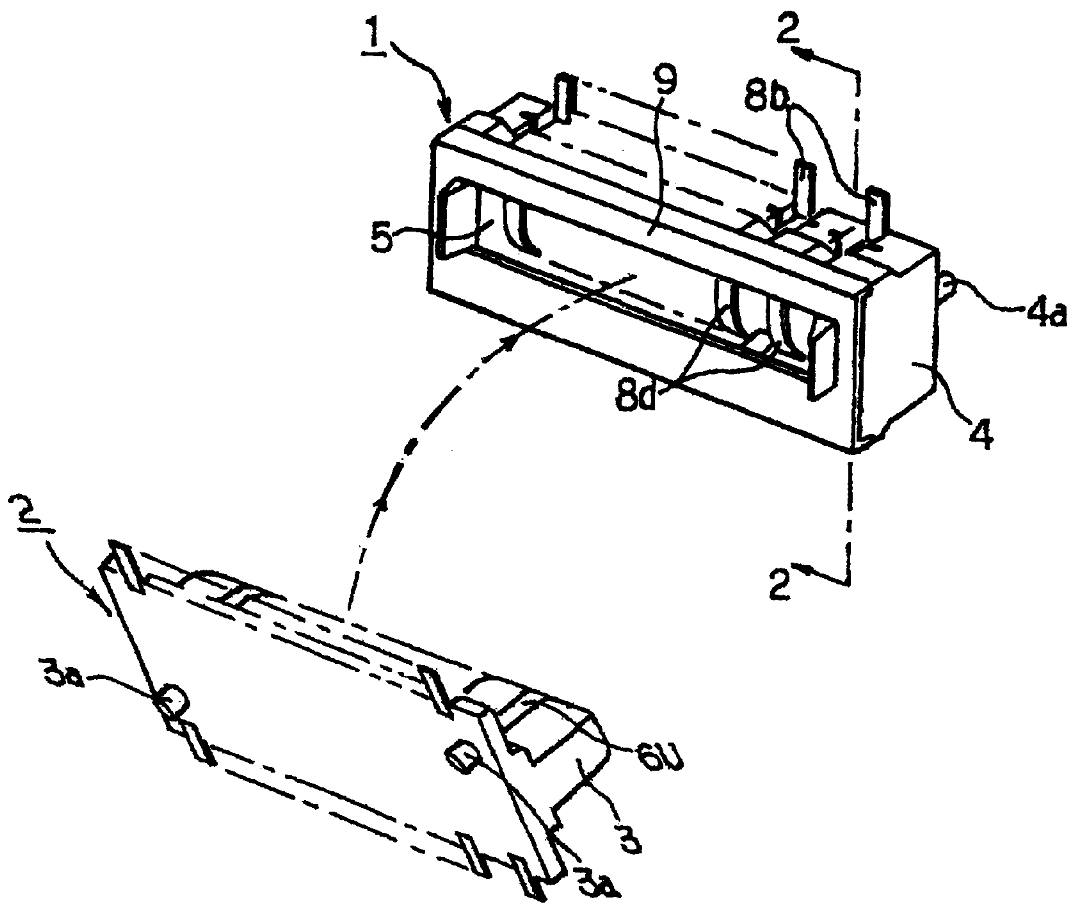

Referring to FIG. 1 and FIG. 2, a connector socket 1 according to the present invention can be, for example, fixed to the front surface of main stereo unit X of a car stereo. A connector plug 2 connected to connector socket 1 is fixed to a back surface of a front panel Y of this car stereo.

A plug section 3 of connector plug 2 includes a positioning pin 3*a* to provide positioning relative to a printed circuit substrate y. Plug section 3 is inserted along an engagement path K into a plug insertion opening 5, which is formed on the surface of a connector mold 4, to be described later, of connector socket 1.

Referring to FIG. 2, plug section 3 extends in a direction perpendicular to the plane of the page. Multiple pairs of plug contacts 6U, 6L are exposed on the upper and lower surfaces of the front end of plug section 3. Referring to FIG. 2, plug contacts 6U, 6L are arranged in rows perpendicular to the plane of page.

Connector mold 4, which is molded from an insulating resin, is fixed to a printed circuit substrate x of main stereo unit X. Connector mold 4 is positioned via a positioning pin 4*a*. Pairs of contact holding chambers 7U, 7L are formed side-by-side as upper and lower rows extending perpendicular to the plane of the page. Multiple pairs of contacts 8U, 8L are placed from above and below connector mold 4 into contact holding chambers 7U, 7L. Contacts 8U, 8L are arranged so that there is symmetry between the upper and lower portions of plug section 3.

A plug insertion opening 5 is formed on the front surface of connector mold 4 to receive plug section 3. Plug insertion opening 5 is formed continuously with contact chambers 7U, 7L. Plug insertion opening 5 is disposed toward the upper section and is positioned asymmetrically upward relative to contacts 8U, 8L. The reason for this is that when front panel Y has a bottom hinge, the engagement path K for plug section 3 forms an arcuate path having a relatively small radius of curvature with a center of rotation below connector mold 4. The asymmetrical positioning of plug insertion opening 5 allows the end of plug section 3 to pass through insertion opening 5 without obstruction. Furthermore, by making vertical opening width W of plug insertion opening 5 as small as possible, the insertion of a charged fingertip or foreign objects into plug insertion opening 5 is prevented.

An electrically grounded shield plate 9 is positioned around plug insertion opening 5 to cover the entire front surface of connector mold 4. Thus, when an electrostatically charged fingertip is about to be inserted into plug insertion opening 5, contact between the fingertip and shield plate 9 causes the static electricity on the fingertip to be grounded via shield plate 9, thereby protecting internal elements from static discharge.

Figure 3:
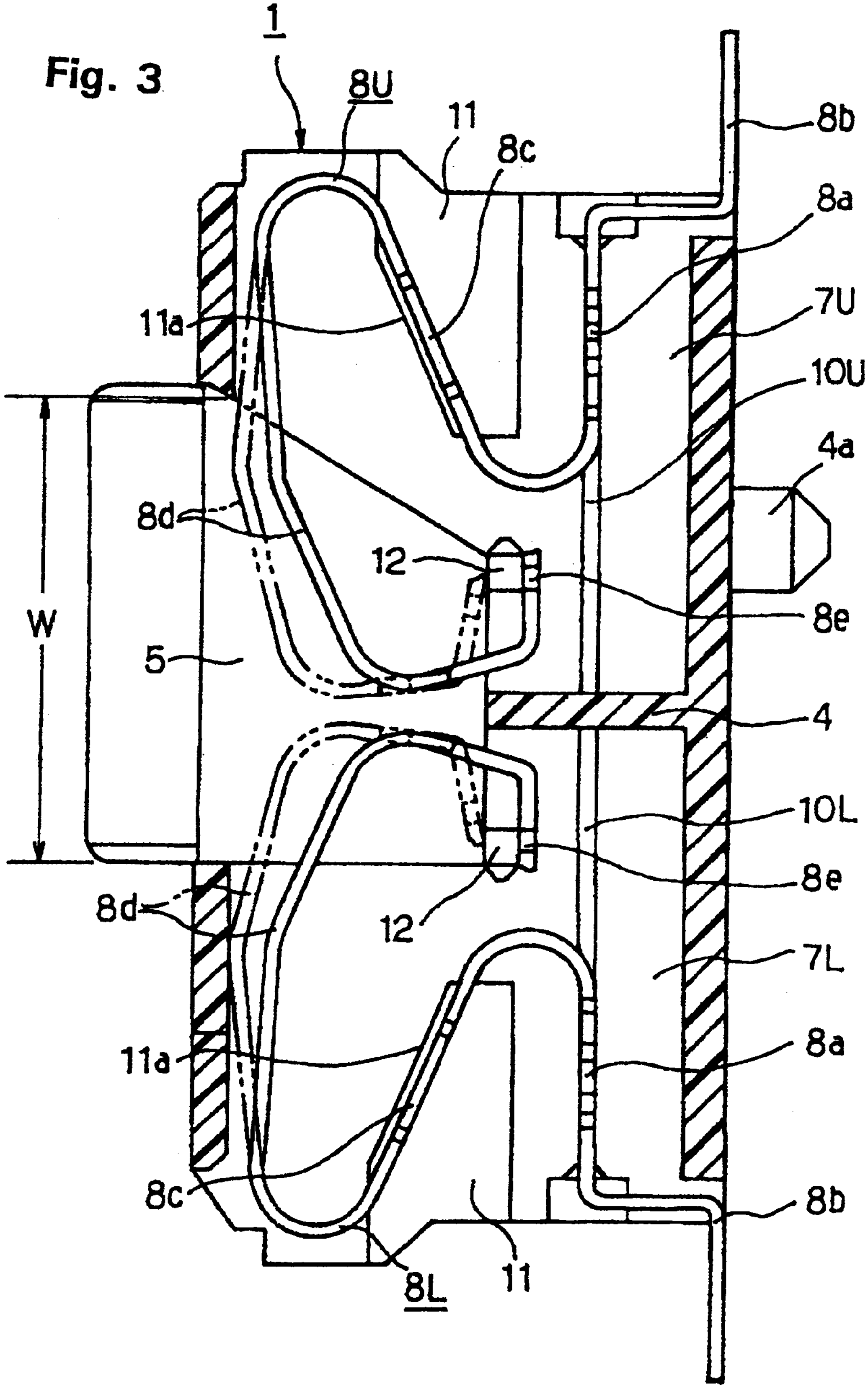
FIG. 3 is an enlarged cross-section drawing of the connector socket.
Figure 6:
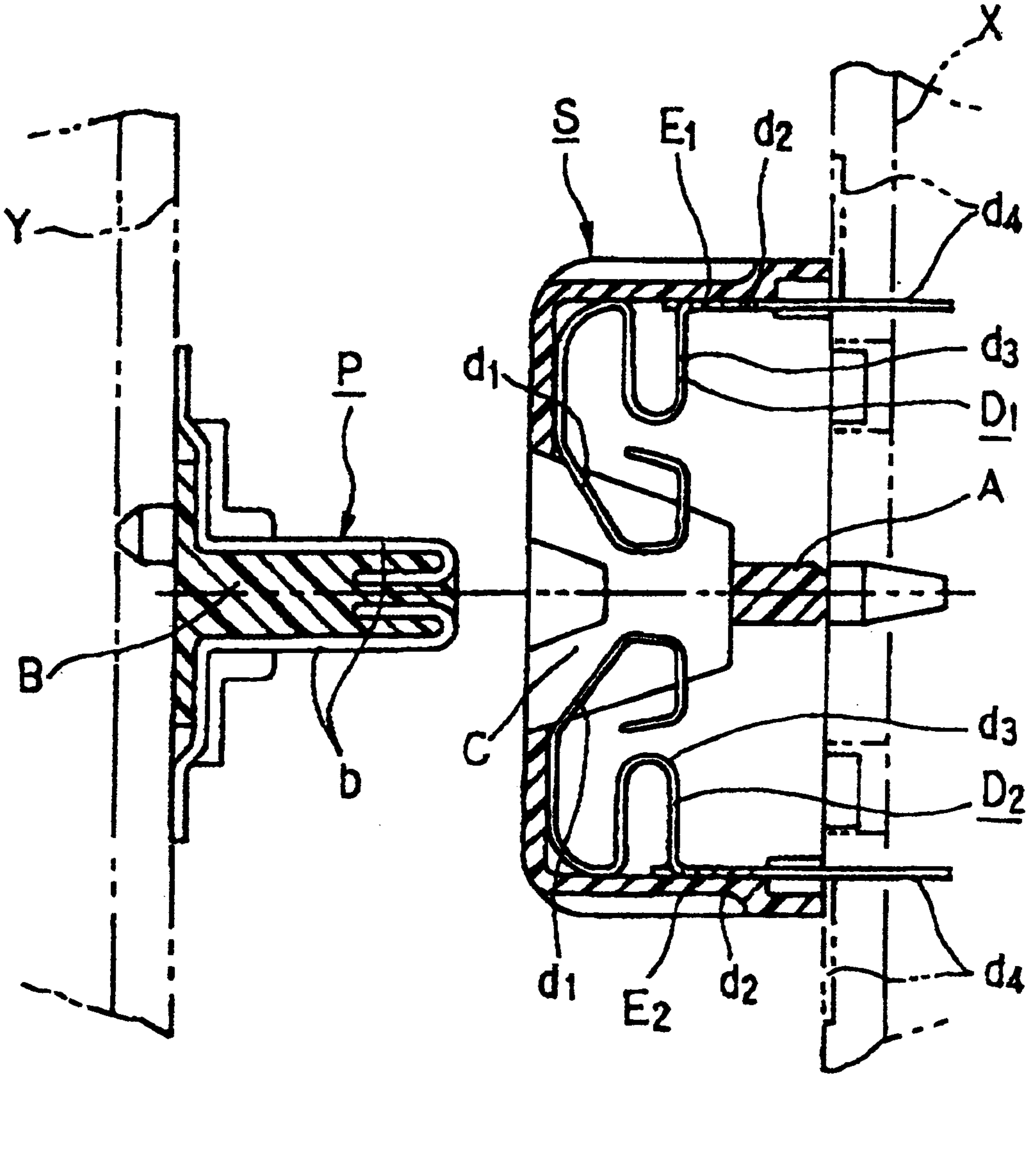
Fig. 6 PRIOR ART
FIG. 6 is a perspective drawing showing the relationship between the connector socket and the connector plug in an example from the conventional technology.

Referring to FIG. 3 and FIG. 4, the manner in which contacts 8U, 8L are attached is shown. Base enlargements 8*a* are formed as widened sections of contacts 8U, 8L. Base attachment grooves 10U, 10L are formed vertically on the inner wall surfaces of contact holding chambers 7U, 7L, which hold contacts 8U, 8L. Base attachment grooves 10U, 10L are formed so that base enlargement 8*a* of contacts 8U, 8L can be pressed into base attachment grooves 10U, 10L. Stopping projections formed on base enlargements 8*a* allow contacts 8U, 8L to be fixed inside contact holding chambers 7U, 7L.

Contacts 8U, 8L include external connection terminals 8*b*, which are continuous with base enlargement 8*a*. Before being attached to connector mold 4, external connection terminals 8*b* are formed with right angles and are parallel to the back surface of connector mold 4. A pressing operation results in a bend on one side of base enlargement 8*a*, thus providing a precise bend for external connection terminal 8*b*.

Contacts 8U, 8L are formed with center sections that are bent away from base enlargements 8*a*. Center section stoppers 8*c*, which are disposed at these center sections, are positioned within center section engagement openings 11. Center section engagement openings 11 are formed from above and below on the inner walls of contact holding chambers 7U, 7L. An engagement section 11*a* on center section engagement opening 11 prevents center section stopper 8*c* from moving forward (to the left in FIG. 3).

A bend resembling the bend in a hairpin is formed near the center sections of contacts 8U, 8L. An arcuate pressure-contact end 8*d* is exposed in plug insertion opening 5. Pressure-contact end 8*d* can be elastically deformed by plug section 3 of connector plug 2. An end projection 8*e* is formed at the end of pressure-contact end 8*d*. Small projections 12, positioned to engage end projection 8*e*, are formed facing each other inside each of contact holding chambers 7U, 7L. This provides stable positioning of pressure-contact ends 8*d*.

Connector socket 1 according to the embodiment shown in the drawings is configured as described above and can be assembled according to the steps described below.

A bending operation is performed by using a press on contacts 8U, 8L. External connection terminals 8*b* at one end of base enlargements 8*a* are bent. Base enlargements 8*a* of contacts 8U, 8L are guided along base attachment grooves 10U, 10L so that contacts 8U, 8L are moved into contact holding chambers 7U, 7L of connector mold 4. Referring to FIG. 3, base enlargements 8*a* of contracts 8U, 8L are pressed into and fixed in base attachment grooves 10U, 10L so that pressure-contact ends 8*d* of contacts 8U, 8L are positioned as indicated by the dotted lines in FIG. 3.

Pressure-contact ends 8*d* of contacts 8U, 8L are deformed slightly to permit displacement of end projection 8*e* of pressure-contact end 8*d* past corresponding projection 12. Pressure-contact end 8*d* is restored slightly due to elastic deformation behind projection 12 which serves to stop and retain end projection 8*e* of pressure-contact end 8*d*. Thus, the connector is assembled in a manner that prevents pressure-contact end 8*d* from being deformed too far in the rearward direction.

Also, assembly of contacts 8U, 8L of connector mold 4 does not involve the application of external force on external connection terminals 8*b* of contacts 8U, 8L. Thus, external connection terminals 8*b* can be bent accurately and kept parallel to the surface of printed circuit substrate x to which they will be attached.

In a car stereo installation, when plug section 3 is inserted into plug insertion opening 5, plug section 3 pushes apart pressure-contact ends 8*d* of contacts 8U, 8L, as indicated by the solid lines in FIG. 2. End projections 8*e* of pressure-contact ends 8*d* move rearward away from projections 12. Contacts 8U, 8L, which correspond to plug contacts 6U, 6L of plug section 3 come into contact with pressure-contact end 8*d*, thus providing an electrical connection between main stereo unit Y and plug 2.

When connector plug 2 is in the state shown in FIG. 2 and is then pulled out, pressure-contact ends 8*d* are drawn toward plug insertion opening 5 by the friction of pressure-contact ends 8*d* of contacts 8U, 8L on plug contacts 6U, 6L. Center stoppers 8*c* of contacts 8U, 8L come into contact with and are restricted by engagement surface 11*a* of center section engagement opening 11. Thus excessive displacement of the center section is prevented and end projection 8*e* is reliably prevented from disengaging from projection 12 due to excessive deformation of pressure-contact end 8*d*.

In connector socket 1 according to the embodiment shown in the drawings, shield plate 9 is positioned around plug insertion opening 5 to cover the entire front surface of connector mold 4. Thus, when an electrostatically charged fingertip is about to be inserted into plug insertion opening 5, the contact between the fingertip and shield plate 9 grounds the electrostatic charge at the fingertip via shield plate 9. Thus, even if the fingertip were to come into contact with pressure-contact end 8*d* of contacts 8U, 8L, the electrostatic charge is prevented from going through pressure-contact end 8*d* and flowing into the internal circuitry connected to contacts 8U, 8L.

As the description above makes clear, the present invention minimizes the area of the plug insertion opening. Thus, it is possible to prevent an electrostatically charged fingertip from being inserted into the plug insertion opening and touching the contact within.

According to the present invention, the electrostatic charge on a fingertip is grounded via the shield plate. Thus, even if the contacts within the plug insertion opening are touched, the electrostatic charge can be eliminated beforehand.

According to the present invention, a connector socket having these advantages can be assembled easily.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A connector socket comprising:

a connector mold;

a plug insertion opening on a surface of said connector mold;

said plug insertion opening being positioned for receiving a plug section of a connector plug;

said connector plug being movable along an arcuate path into said plug insertion opening;

a plurality of pairs of contacts facing each other across a width of said plug insertion opening and arranged along a length of said connector mold; and said plug insertion opening is displaced from a centerline of said facing pairs of contacts thereby enabling a width of said plug insertion opening to be minimized.

2. A connector socket as described in claim 1 further comprising:

a conductive shield plate disposed at a surface of said connector mold surrounding said plug insertion opening.

3. A connector socket as described in claim 1 wherein:

a plurality of pairs of contact holding chambers are formed side by side along the length of said connector mold; and said contacts held in said contact holding chambers are mounted from the sides of said connector mold into corresponding contact holding chambers, which are opened toward either side of said connector mold.

4. A connector socket as described in claim 2 wherein:

a plurality of pairs of contact holding chambers are formed side by side along the length of said connector mold; and said contacts held in said contact holding chambers are mounted from the sides of said connector mold into corresponding contact holding chambers, which are opened toward either side of said connector mold.

5. A connector socket comprising:

a connector mold;

said connector mold including at least a first contact holding chamber;

said contact holding chamber having a contact insertion opening in its side;

a base attachment groove in said connector mold passing from said contact insertion opening into said contact holding chamber;

a contact;

said contact including a base enlargement;

said base enlargement being slidably fitted into and along said base attachment groove to permit installation of said contact into said contact holding chamber from said side during assembly of said connector socket; and at least one engagement member contacted by said contact preventing drawing of said contact from said contact holding chamber when a mating connector plug is withdrawn.

6. A connector socket according to claim 5 wherein said at least one engagement member includes:

a projection positioned to engage a bent end of said contact;

said projection being positioned to permit a first surface of said bent end to contact an outer surface of said projection;

said projection being positioned to permit slight deformation of said bent end to pass said bent end behind said projection, whereby said bent end is retained inside said contact holding chamber.

* * * * *